(12) United States Patent
Lammel et al.

(10) Patent No.: US 11,140,774 B2
(45) Date of Patent: Oct. 5, 2021

(54) PRINTED CIRCUIT BOARD AND METHOD FOR PROCESSING A PRINTED CIRCUIT BOARD

(71) Applicant: VITESCO TECHNOLOGIES GMBH, Hannover (DE)

(72) Inventors: Christian Lammel, Munich (DE); Guenther Ruppaner, Munich (DE); Robert Bushnell, Munich (DE); Detlev Bagung, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 16/753,894

(22) PCT Filed: Oct. 4, 2018

(86) PCT No.: PCT/EP2018/077046
§ 371 (c)(1),
(2) Date: Apr. 6, 2020

(87) PCT Pub. No.: WO2019/068826
PCT Pub. Date: Apr. 11, 2019

(65) Prior Publication Data
US 2020/0260576 A1   Aug. 13, 2020

(30) Foreign Application Priority Data
Oct. 6, 2017 (DE) .................... 102017217797.7

(51) Int. Cl.
*H05K 1/00* (2006.01)
*H05K 1/02* (2006.01)
(Continued)

(52) U.S. Cl.
CPC ......... *H05K 1/0278* (2013.01); *H05K 1/0281* (2013.01); *H05K 1/189* (2013.01);
(Continued)

(58) Field of Classification Search
USPC ......................................................... 361/749
See application file for complete search history.

(56) References Cited

U.S. PATENT DOCUMENTS

| 4,700,880 A | 10/1987 | Glover |
| 5,130,499 A | 7/1992 | Dijkshoorn |

(Continued)

FOREIGN PATENT DOCUMENTS

| EP | 1575344 A1 | 9/2005 |
| JP | 2007258593 A | 10/2007 |
| WO | 2009021633 A1 | 2/2009 |

OTHER PUBLICATIONS

Christopher G. L: "Rigid Printed Circuit Board With Integrated Flexible Bend Areas", Motorola Technical Developments, Motorola Inc. Schaumburg, Illinois, US, (Mar. 1, 1997), vol. 30, ISSN 0887-5286, p. 65-66, XP000657364.

*Primary Examiner* — Andargie M Aychillhum
(74) *Attorney, Agent, or Firm* — Laurence A. Greenberg; Werner H. Stemer; Ralph E. Locher

(57) ABSTRACT

A printed circuit board has first, second, and third printed circuit board sections extending along a longitudinal direction between two transverse edge outer sides of the printed circuit board. The printed circuit board has at each of its two longitudinal ends a respective transverse edge strip, which has regions of the first, second, and third printed circuit board sections and extends continuously transversely with respect to the longitudinal direction along a transverse edge outer side. A depression is formed in the third printed circuit board section on the first printed circuit board side between the two transverse edge strips. The first and/or second printed circuit board sections has a first metallic conductor track section that extends electrically conductively right into one or both of the two transverse edge strips.

17 Claims, 6 Drawing Sheets

(51) Int. Cl.
*H05K 1/18* (2006.01)
*H05K 3/30* (2006.01)
*H01R 12/57* (2011.01)
*H01R 12/58* (2011.01)

(52) U.S. Cl.
CPC ............ *H05K 3/303* (2013.01); *H01R 12/57* (2013.01); *H01R 12/585* (2013.01); *H05K 2201/0191* (2013.01); *H05K 2201/09063* (2013.01); *H05K 2201/09227* (2013.01); *H05K 2201/10189* (2013.01); *H05K 2201/10522* (2013.01); *H05K 2201/10545* (2013.01)

(56) References Cited

U.S. PATENT DOCUMENTS

| | | | |
|---|---|---|---|
| 9,238,365 B1* | 1/2016 | Nystrom | H05K 1/028 |
| 2003/0067754 A1* | 4/2003 | Bauer | H05K 7/205 |
| | | | 361/760 |
| 2004/0233564 A1 | 11/2004 | Kim | |
| 2011/0140690 A1* | 6/2011 | Antraygue | G05G 1/04 |
| | | | 324/207.25 |
| 2015/0108630 A1* | 4/2015 | Izuno | H01L 23/49833 |
| | | | 257/713 |
| 2017/0142829 A1* | 5/2017 | Yu | H05K 3/4691 |

\* cited by examiner

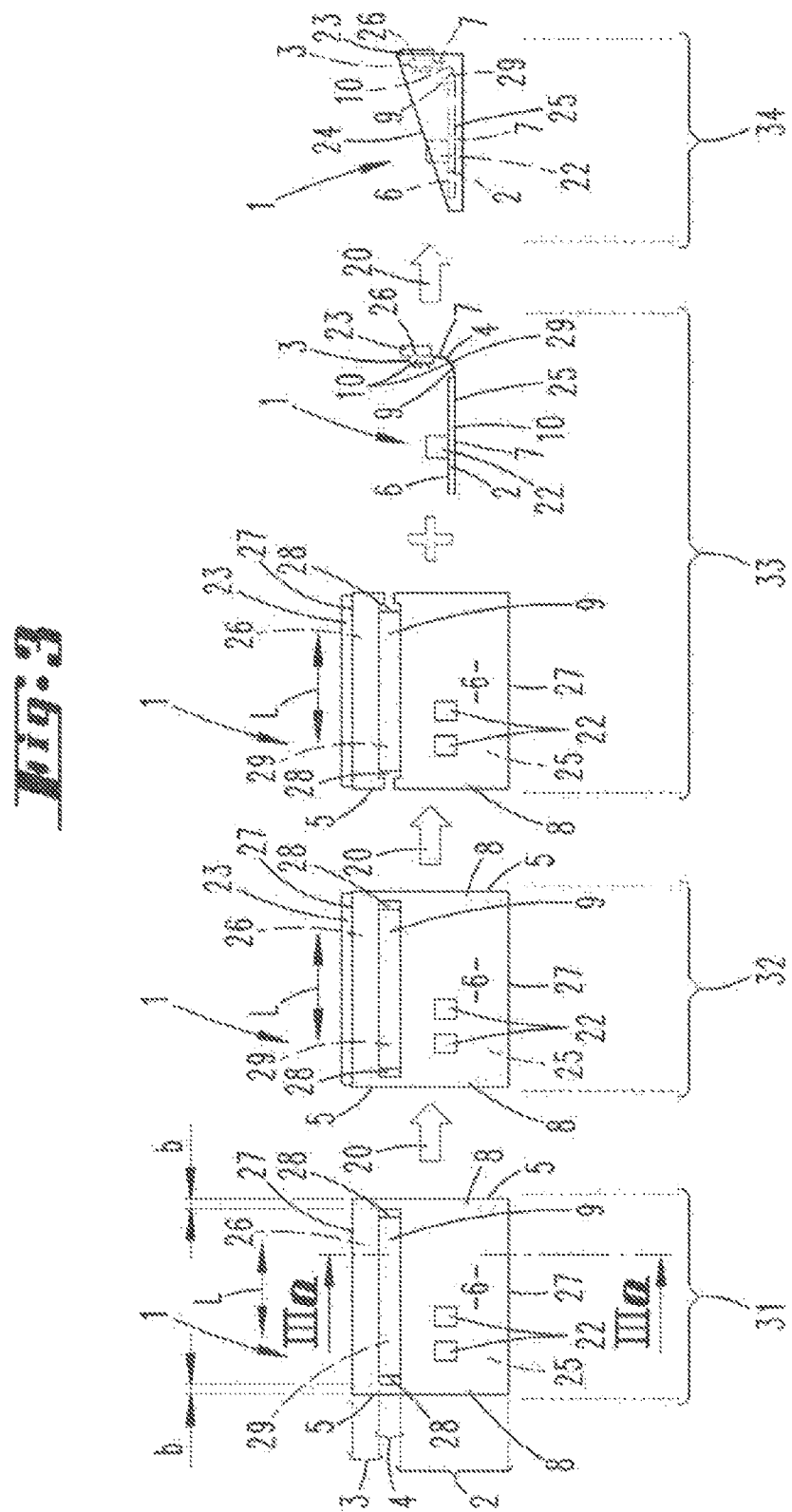

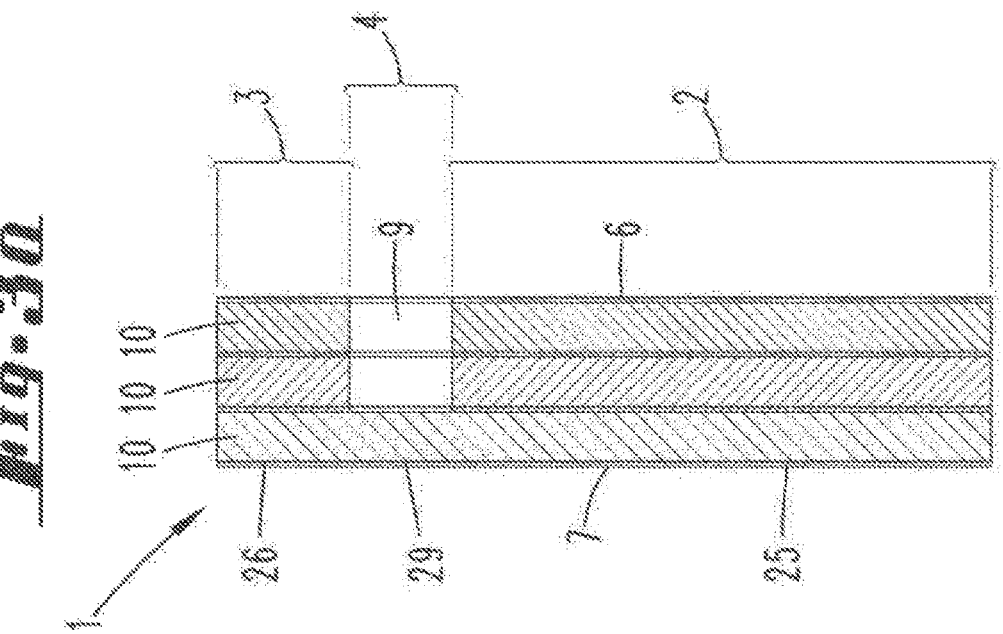
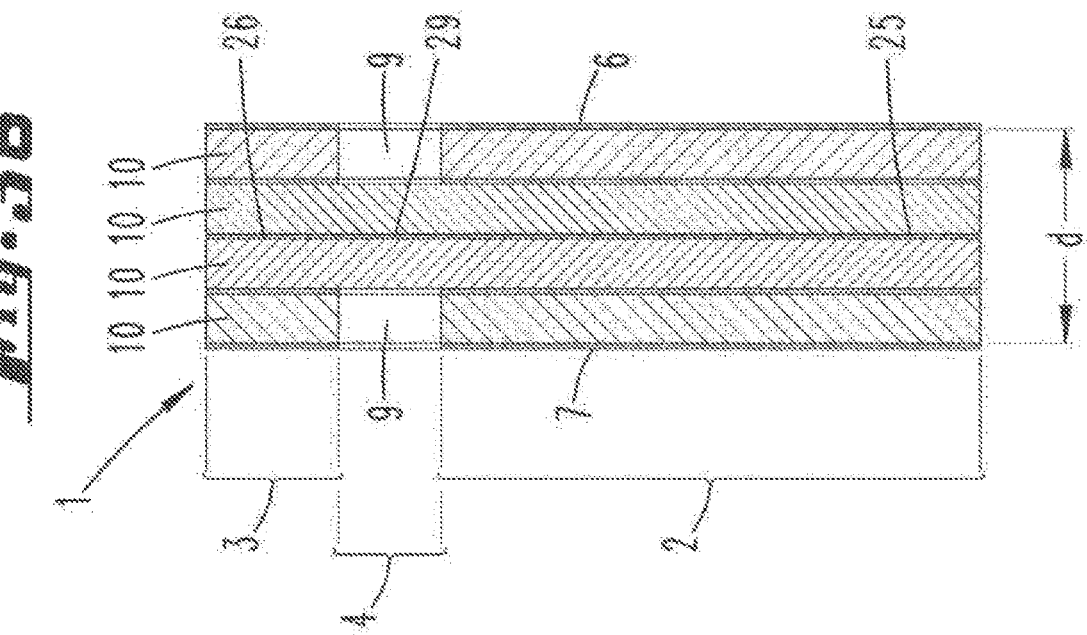

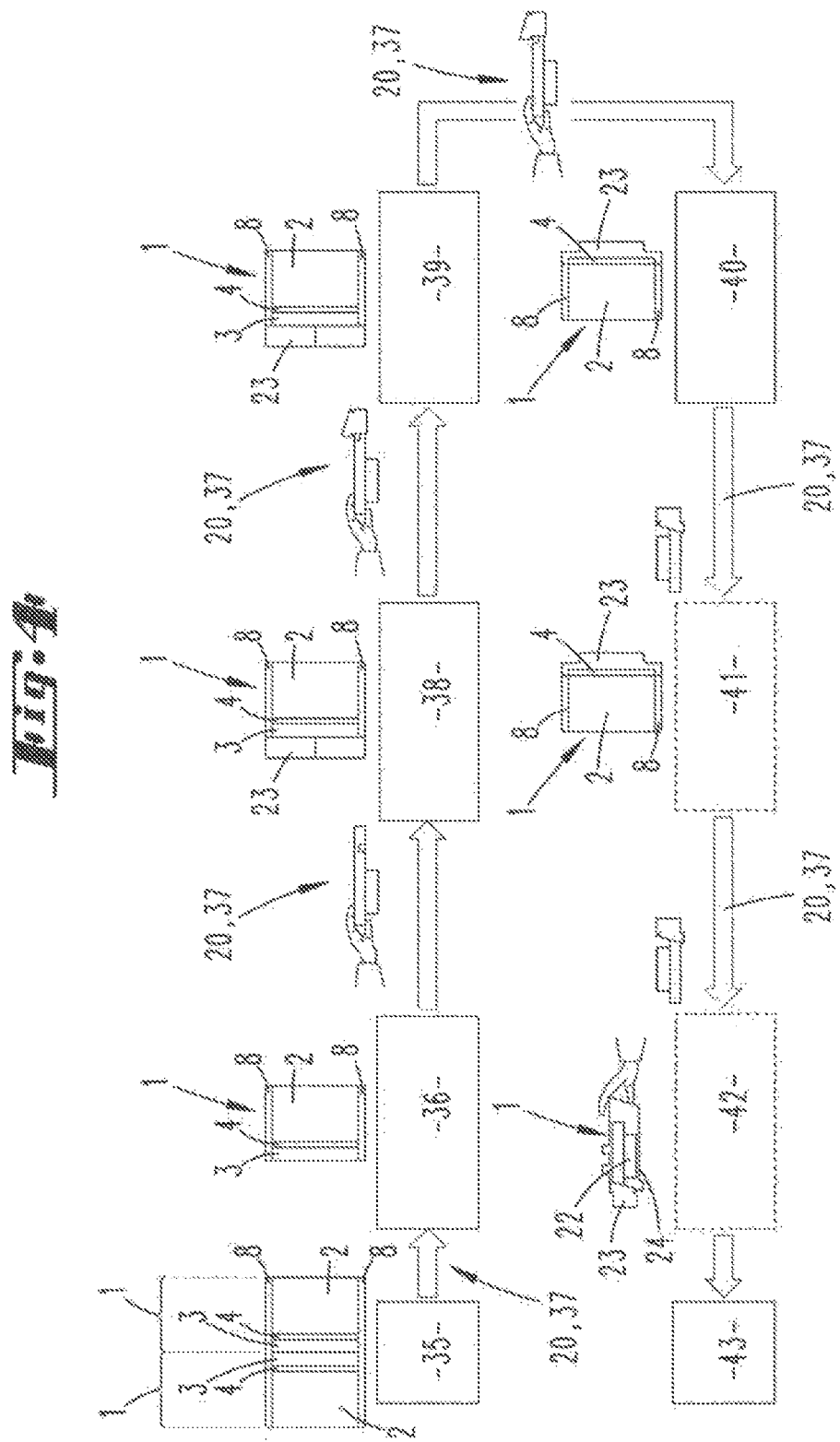

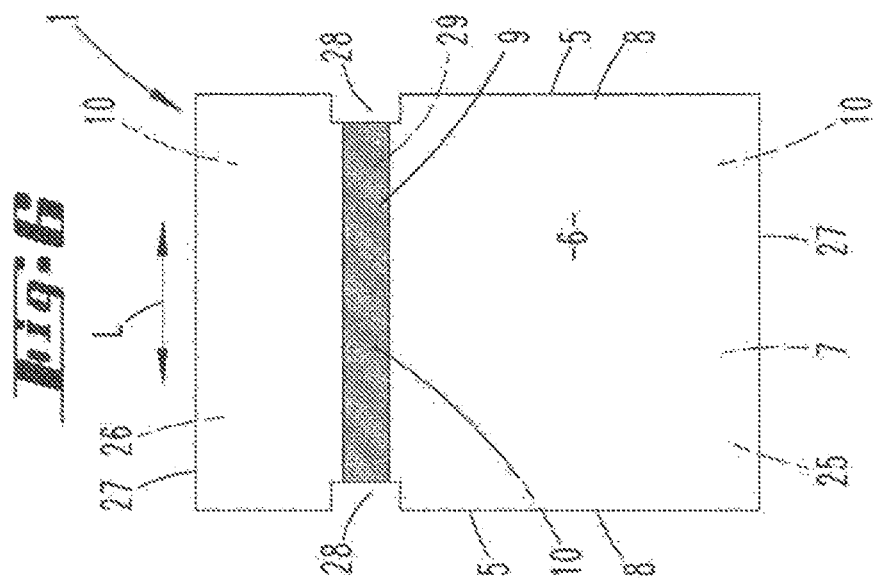
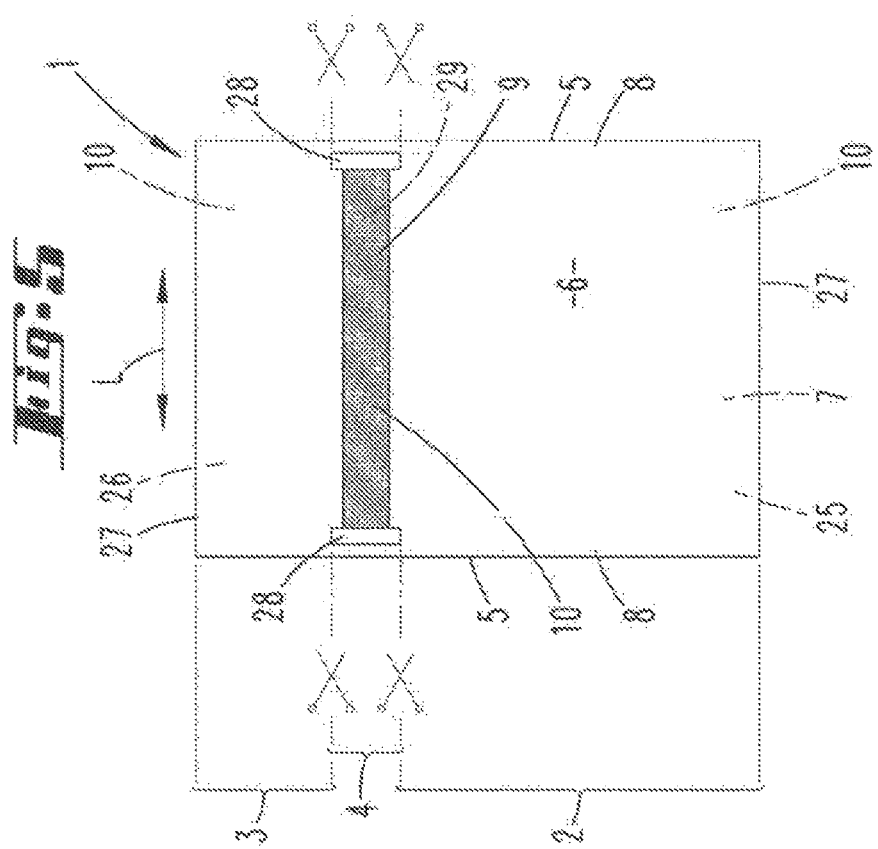

US 11,140,774 B2

PRINTED CIRCUIT BOARD AND METHOD FOR PROCESSING A PRINTED CIRCUIT BOARD

TECHNICAL FIELD

The present invention relates, in accordance with a first aspect, to a printed circuit board, comprising a first printed circuit board section, a second printed circuit board section and a third printed circuit board section, which extend along a printed circuit board longitudinal direction between two transverse edge outer sides of the printed circuit board, wherein the third printed circuit board section is arranged between the first printed circuit board section and the second printed circuit board section, wherein the printed circuit board forms a first printed circuit board side and a second printed circuit board side, which face in mutually opposite directions, wherein the printed circuit board has at each of its two longitudinal ends in relation to the printed circuit board longitudinal direction a respective transverse edge strip, which has regions of the first, second and third printed circuit board sections at least in an initial state of the printed circuit board and which extends continuously transversely with respect to the printed circuit board longitudinal direction along a transverse edge outer side at least in the initial state, wherein a depression oriented, in particular in a strip-shaped fashion, along the printed circuit board longitudinal direction is formed in the third printed circuit board section on the first printed circuit board side between the two transverse edge strips, and wherein the first printed circuit board section, in particular at the surface of the first printed circuit board side, has a first metallic conductor track section and/or the second printed circuit board section, in particular at the surface of the first printed circuit board side, has a first metallic conductor track section.

The invention also relates, in accordance with a further aspect, to a method for processing a printed circuit board in production, comprising the following method steps: providing at least one printed circuit board mentioned in the preceding paragraph, populating the printed circuit board with electrical and/or electronic components, preferably with unwired components (so-called surface mounted devices=SMD), attaching a circuit board connector, preferably a press-fit connector or a solder-in connector, to the second printed circuit board section, bending the second printed circuit board section, such that a first plane running parallel to the first printed circuit board section and a second plane running parallel to the second printed circuit board section intersect at an angle that is, in particular, approximately 90 degrees or 90 degrees.

PRIOR ART

A printed circuit board comprises layer by layer electrically insulating printed circuit board material (for example fiber-reinforced epoxy resin, polyimide or the like) and one or more electrically conductive conductor tracks adhering thereto. In this respect, with regard to different printed circuit board sections, mention can be made of assigned conductor track sections. One printed circuit board can be involved, for example. In the case of a conceivable printed circuit board having only one such layer, a metallic, that is to say electrically conductive, conductor track can be applied, in particular laminated, on one or both surfaces. Alternatively, a printed circuit board having a plurality of layers composed of electrically insulating material can be involved, wherein a desired number of conductor tracks can be formed between these layers and if necessary on the outer surfaces of the layers. In the case of multilayered printed circuit boards, the inherent stiffness is often so high that the forces acting during their processing, that is to say in particular during the separation of panels, during population with components and connectors and during incorporation into a housing do not result in any undesired deformation.

For many applications, however, a contact outgoer that is parallel to the circuit plane and hence saves space is desired, without contacts that are bent and thus susceptible to short circuits being intended to be used in this case. To that end, it is known from EP 1 575 344 B1, for example, that a depression is formed in the printed circuit board in the third printed circuit board section at least on one printed circuit board side by means of so-called depth milling, with the result that the printed circuit board has there a smaller material thickness in comparison with the first and second printed circuit board sections and thus also has a significantly lower inherent stiffness there. In the case of such printed circuit boards, the third printed circuit board section forms a semiflexible section that enables bending at least once by a desired angle, often 90 degrees, without breaking into pieces. The bending, preferably by 90 degrees, in the third printed circuit board section enables a parallel contact outgoer without angled contact pins. However, in this case, the lower stiffness in the third printed circuit board section is associated with the risk of the printed circuit board being undesirably deformed by forces, bending moments etc. acting on it during processing/production. In order to prevent this, the prior art discloses a printed circuit board illustrated in FIGS. 1 and 2 and the processing of said printed circuit board. In these schematic illustrations and the following description thereof, reference numerals for identification as prior art and in this respect for differentiation from the invention are identified by an appended "'".

FIG. 1 shows with regard to the prior art a printed circuit board 1' mentioned in the introduction and a known method for processing said printed circuit board. The printed circuit board 1' comprises a first printed circuit board section 2', a second printed circuit board section 3' and a third printed circuit board section 4', which extend along a printed circuit board longitudinal direction L' between the two longitudinal ends or transverse edge outer sides 5' of the printed circuit board 1'. The printed circuit board 1' forms a first printed circuit board side 6' and a second printed circuit board side 7', which face in mutually opposite directions. In relation to the printed circuit board longitudinal direction L', the printed circuit board 1' has at each of its two longitudinal ends a respective transverse edge strip 8', which serves for stabilizing the printed circuit board 1' in order to avoid undesired deformations and in this respect as a protective edge. A respective transverse edge strip 8' extends in a manner adjoining and along a respective transverse edge outer side 5', specifically continuously, that is to say without an interruption, in a direction perpendicular to the printed circuit board longitudinal direction L'. In the third printed circuit board section 4', a strip-shaped depression 9' is formed between the two transverse edge strips 8', on account of which strip-shaped depression the printed circuit board 1' has, in the second printed circuit board section 3', a lower stiffness in comparison with the other two printed circuit board sections 2', 3' and is bendable as a result. The first printed circuit board section 2', at the surface of the second printed circuit board side 7' has a first metallic conductor track 25' and the second printed circuit board section 3', at the surface of the second printed circuit board side 7', has a first metallic conductor track 26'. The third printed circuit board section 4', at the second printed circuit board side 7', has a first printed circuit board section 29', which electrically connects the first printed circuit board sections 25, 26'. Taking this as a departure point, various situations and method steps of a known method for processing such a printed circuit board 1' are illustrated schematically in a simplified manner in FIG. 1. In this case, 11' and 12' represent singulating and populating the printed circuit board 1' with electrical and/or electronic components 22'. The reference sign 20' denotes a respective transport process at the various positions. In a method step 13', the two transverse edge strips are completely separated. In the method step 14', a circuit board connector 23' is press-fitted into the second printed circuit board section 3'. In a method step 16', the printed circuit board 1' is bent by an angle of 90° in the region of the third printed circuit board section 4' and, in the method step 18', the printed circuit board 1' is incorporated into a housing 24'. The known method is found to be disadvantageous in multiple respects. After the early separation of the transverse edge strips 8', which initially stabilize the printed circuit board 1' against deformations, the printed circuit board 1' becomes unstable during handling; there is an increased risk of inadvertent warpage of the third printed circuit board region 4', in particular initiated by its own weight and/or the weight of components, and the risk of potential damage. The transverse edge strips 8' fulfil their function as protective edges affording protection against deformations in the known method only during the process of populating the printed circuit board 1' with components 22' (in particular by means of soldering) and during the process of separating a plurality of panel boards or printed circuit board 1' from one another for the purpose of singulating them. Afterward, the transverse edge strips 8' have no function and are disposed of. They cannot be used for the layout of a circuit created on the printed circuit board 1', but nevertheless cause costs. During handling without the protective transverse edge strips 8', damage to the bending zone in the third printed circuit board section 4' can occur. Special handling specifications are therefore required.

A known method for processing a printed circuit board 1', which method contains additional method steps in comparison with FIG. 1, is illustrated schematically in FIG. 2. In method step 11', a plurality of printed circuit boards 1', initially still connected to one another, are populated with unwired components (so-called SMD), which in part are not concomitantly illustrated in FIG. 2, by means of soldering. During this, the transverse edge strips 8' act as stabilizing protective edges, with the result that simple handling is possible. In method step 12', the printed circuit boards 1' were separated from one another and, in method step 13', which is either at the same time or directly following, the complete transverse edge strips 8' were separated from the remainder of the printed circuit board 1'. Since the protective effect of the transverse edge strips 8' is eliminated, careful handling 21' is required between and during the subsequent method steps. In method step 14', a circuit board connector 23' is press-fitted into the second printed circuit board section 3'. During method step 15', electrical functional testing at the component level is carried out. During method step 16', the printed circuit board 1' is bent in the printed circuit board section 4'. A functional test of all circuit functions is carried out during method step 17', the printed circuit board 1' is incorporated into a housing 24' during method step 18', and a final test is carried out during method step 19'.

SUMMARY OF THE INVENTION

Against this background, the invention is based on the object of advantageously developing a printed circuit board of the generic type, wherein in particular an increase in quality, a reduction of costs and the possibility of more secure transport are thereby striven for. Concerning the method of the generic type, the invention, likewise preceding from the prior art described, is based on the object of improving the method, wherein in particular an increase in quality, a reduction of costs and the possibility of more secure transport of the printed circuit boards is striven for.

With regard to a printed circuit board of the generic type, in order to achieve the stated object, the invention proposes that the first conductor track section of the first printed circuit board section extends in an electrically conductive manner from a region situated between the two transverse edge strips right into one of the two transverse edge strips or in an electrically conductive manner from a region situated between the two transverse edge strips right into both transverse edge strips, and/or that the first conductor track section of the second printed circuit board section extends in an electrically conductive manner from a region situated between the two transverse edge strips right into one of the two transverse edge strips or in an electrically conductive manner from a region situated between the two transverse edge strips right into both transverse edge strips. This makes it possible for the transverse edge strips serving as protective edges, in the region of the first printed circuit board section and of the second printed circuit board section, to provide an area that is usable for the conductor track or conductor tracks, i.e. for the layout or for a circuit on the printed circuit board. That is based on the likewise advantageous concept that the transverse edge strips, at least in the region of the first printed circuit board section and of the second printed circuit board section, do not have to be separated and thus do not have to be disposed of, but rather can perform a permanent function. There is the possibility, for example, of the first conductor track section of the first printed circuit board section extending in a region between the two transverse edge strips and from there in an electrically conductive manner right into one transverse edge strip or right into both transverse edge strips. Alternatively or combinationally, there is the possibility, for example, of the first conductor track section of the second printed circuit board section extending in a region between the two transverse edge strips and from there in an electrically conductive manner right into one transverse edge strip or right into both transverse edge strips. The initial state can be an arbitrary state of the printed circuit board in which a respective transverse edge strip has regions of the first, second and third printed circuit board sections and extends continuously along a transverse edge outer side. For example (that is to say not necessarily), a state in which the printed circuit board has not yet been populated with electrical and/or electronic components can be involved.

There are numerous possibilities for preferred and expedient development. In this regard, there is the possibility that the first conductor track section of the first printed circuit board section extends in an electrically conductive manner as far as one transverse edge outer side or in an electrically conductive manner as far as both transverse edge outer sides, and/or that the first conductor track section of the second printed circuit board section extends in an electrically conductive manner as far as one transverse edge outer side or in electrically conductive manner as far as both transverse edge outer sides. The surfaces of the transverse edge strips in the region of the first and second printed circuit board sections can be fully utilized as a result. Moreover, there is the possibility that the third printed circuit board section, in particular at the surface of the first printed circuit board side, has a first metallic conductor track section, which connects the first conductor track section of the first printed circuit board section and the first conductor track section of the second printed circuit board section to one another in an electrically conductive manner. The abovementioned first conductor track sections in the first, second and third printed circuit board sections can integrally form a first conductor track. Each printed circuit board section can have e.g. a second, third etc. conductor track section in addition to a first conductor track section. In this way, the transverse edge strips in the region of the third printed circuit board section can also be utilized at least partly for the layout.

It is preferred for the printed circuit board to be bendable, in particular elastically bendable, in the third printed circuit board section, wherein provision is made, in particular, for the printed circuit board to have at least one flexible layer composed of electrically insulating printed circuit board material, said at least one flexible layer extending, preferably integrally, in the first, second and third printed circuit board sections In this context, bendable means that the printed circuit board can be bent at least once, preferably a number of times, in the third printed circuit board section, without significant damage such as, in particular, cracks occurring therein.

There is the possibility that a respective through opening is formed in the printed circuit board between a respective longitudinal end of the strip-shaped depression and the transverse edge strip adjacent thereto. It is preferred for each transverse edge strip to have a uniform strip thickness, wherein the strip thickness corresponds to the thickness of the printed circuit board in the region of the first printed circuit board section and/or to the thickness of the printed circuit board in the region of the second printed circuit board section. It is preferably provided that each transverse edge strip has a uniform strip width, wherein side edges of the transverse edge strips extend transversely, in particular perpendicularly, with respect to the printed circuit board longitudinal direction.

One preferred development is also seen in the fact that a depression oriented in a strip-shaped fashion along the printed circuit board longitudinal direction is formed in the third printed circuit board section on the second printed circuit board side between the two transverse edge strips. There is the possibility for the first printed circuit board section, in particular at the surface of the second printed circuit board side, to have a second metallic conductor track section and/or for the second printed circuit board section, in particular at the surface of the second printed circuit board side, to have a second metallic conductor track section, for the second conductor track section of the first printed circuit board section to extend in an electrically conductive manner right into one of the two transverse edge strips or in an electrically conductive manner right into both transverse edge strips, and/or for the second conductor track section of the second printed circuit board section to extend in an electrically conductive manner right into one of the two transverse edge strips or in an electrically conductive manner right into both transverse edge strips. Preferably, the depression on the first printed circuit board side can be formed in a manner overlapping the depression on the second printed circuit board side. There is the possibility that the second conductor track section of the first printed circuit board section extends in an electrically conductive manner as far as one transverse edge outer side or in an electrically conductive manner as far as both transverse edge outer sides, and/or that the second conductor track section of the second printed circuit board section extends in an electrically conductive manner as far as one transverse edge outer side or in an electrically conductive manner as far as both transverse edge outer sides It is likewise preferred for the third printed circuit board section, in particular at the surface of the first printed circuit board side, to have a second metallic conductor track section, which connects the second conductor track section of the first printed circuit board section and the second conductor track section of the second printed circuit board section to one another in an electrically conductive manner.

There is the possibility that the first printed circuit board section is populated with electrical and/or electronic components, in particular with unwired components, on one printed circuit board side or on both printed circuit board sides. The printed circuit board and the component or the components can be parts of a circuit. There is the possibility, for example, that one component or a plurality of components between the transverse edge strips is or are connected to the first conductor track section of the first printed circuit board section. There is the possibility that in at least one transverse edge strip at least one electrical or electronic component is connected to the first conductor track section of the first printed circuit board section. Moreover, there is the possibility that in each of the two transverse edge strips in each case at least one electrical or electronic component is connected to the first conductor track section of the first printed circuit board section. There is the possibility that in at least one transverse edge strip at least one electrical or electronic component is connected to the first conductor track section of the second printed circuit board section. Moreover, there is the possibility that in each of the two transverse edge strips in each case at least one electrical or electronic component is connected to the first conductor track section of the second printed circuit board section. There is the possibility and/or that a circuit board connector, in particular a press-fit connector or a solder-in connector, is connected to the second printed circuit board section. The circuit board connector can be a conventional plug connector for printed circuit boards, having a plug connector housing and a contact area and/or connector contacts.

It is considered to be advantageous that the transverse edge strips, which are continuous in an initial state of the printed circuit board, are interrupted only in the third printed circuit board section or removed only in the third printed circuit board section during processing. In this way, the surface of the transverse edge strips in the first and second printed circuit board sections with the conductor track sections there continues to be usable for the layout. With regard to a contact output that to be parallel to a circuit plane, it is preferred for the printed circuit board to be bent in the third printed circuit board section, such that a first plane running parallel to the first printed circuit board section and a second plane running parallel to the second printed circuit board section intersect at an angle that is, in particular, approximately 90 degrees or 90 degrees. It is preferred for the circuit board connector to have snap-action hooks that secure the printed circuit board in the bent state.

With regard to the method mentioned in the introduction, in order to achieve the stated object, the invention proposes that a printed circuit board according to the invention is provided as the printed circuit board and that before the bending the transverse edge strips, which are continuous in the initial state, are interrupted only in the third printed circuit board section or removed only in the third printed circuit board section. This results in the advantages already described in association with a printed circuit board according to the invention.

There are numerous possibilities for preferred development of the method according to the invention. It is preferred for interrupting the transverse edge strips only in the third printed circuit board region or removing the transverse edge strips only in the third printed circuit board region to be carried out between attaching the circuit board connector and bending the third printed circuit board section. By virtue of the fact that interrupting the transverse edge strips is carried out only after attaching the circuit board connector, i.e. only in a later section of the method in comparison with the known method, the stabilization of the effect of the transverse edge strips is advantageously still available during the process of attaching the circuit board connector. As long as the transverse edge strips have not yet been interrupted, no unnecessary or unexpected bending or torsion forces that may occur e.g. during the press-fitting of the circuit board connector, as a result of handling, transport, the weight of the printed circuit board with large components or the like can act on the third printed circuit board section reduced in thickness. As a result, until the transverse edge strips are interrupted, secure transport of the populated printed circuit board in production is possible.

For expedient development, it is proposed that the transverse edge strips are opened, in particular cut or slit or severed by machining or severed by means of a punch or severed thermally or severed in some other way, for the purpose of interrupting them in the third printed circuit board section, or that the transverse edge strips are notched out or milled away or removed by means of some other machining method or punched away or removed in some other way in the third printed circuit board section for the purpose of removing them there. When the transverse edge strips are interrupted (e.g. notched out in the third printed circuit board section), the printed circuit board can be bent in the third printed circuit board section. It follows from the description above that printed circuit boards according to the invention are optimized for handling in production. Finally, there is also the possibility that circuit board connectors having snap-action hooks are used, and that after the process of bending the second printed circuit board section, the bent shape of the printed circuit board is secured by means of the snap-action hooks.

BRIEF DESCRIPTION OF THE DRAWINGS

The prior art and the invention are shown by way of example in each case in the figures. In the figures, in detail:

FIG. 3 shows a printed circuit board according to the invention in accordance with one preferred exemplary embodiment and a method according to the invention for processing said printed circuit board in accordance with a likewise first preferred exemplary embodiment;

FIG. 3a shows the layered construction of the printed circuit board by way of example in an enlarged sectional view along the sectional line IIIa-IIIa from FIG. 3;

FIG. 3b shows a possible variant with respect to the construction shown in FIG. 3a;

FIG. 4 shows a second preferred exemplary embodiment of a method according to the invention for processing a printed circuit board according to the invention;

FIG. 5 shows a printed circuit board according to the invention in accordance with the construction also chosen in FIGS. 3, 4, but enlarged relative thereto, before the transverse edge strips are interrupted, in a plan view;

FIG. 6 likewise shows in a plan view the printed circuit board shown in FIG. 5, but after the transverse edge strips have been interrupted.

DESCRIPTION OF THE EMBODIMENTS

Figure 1:
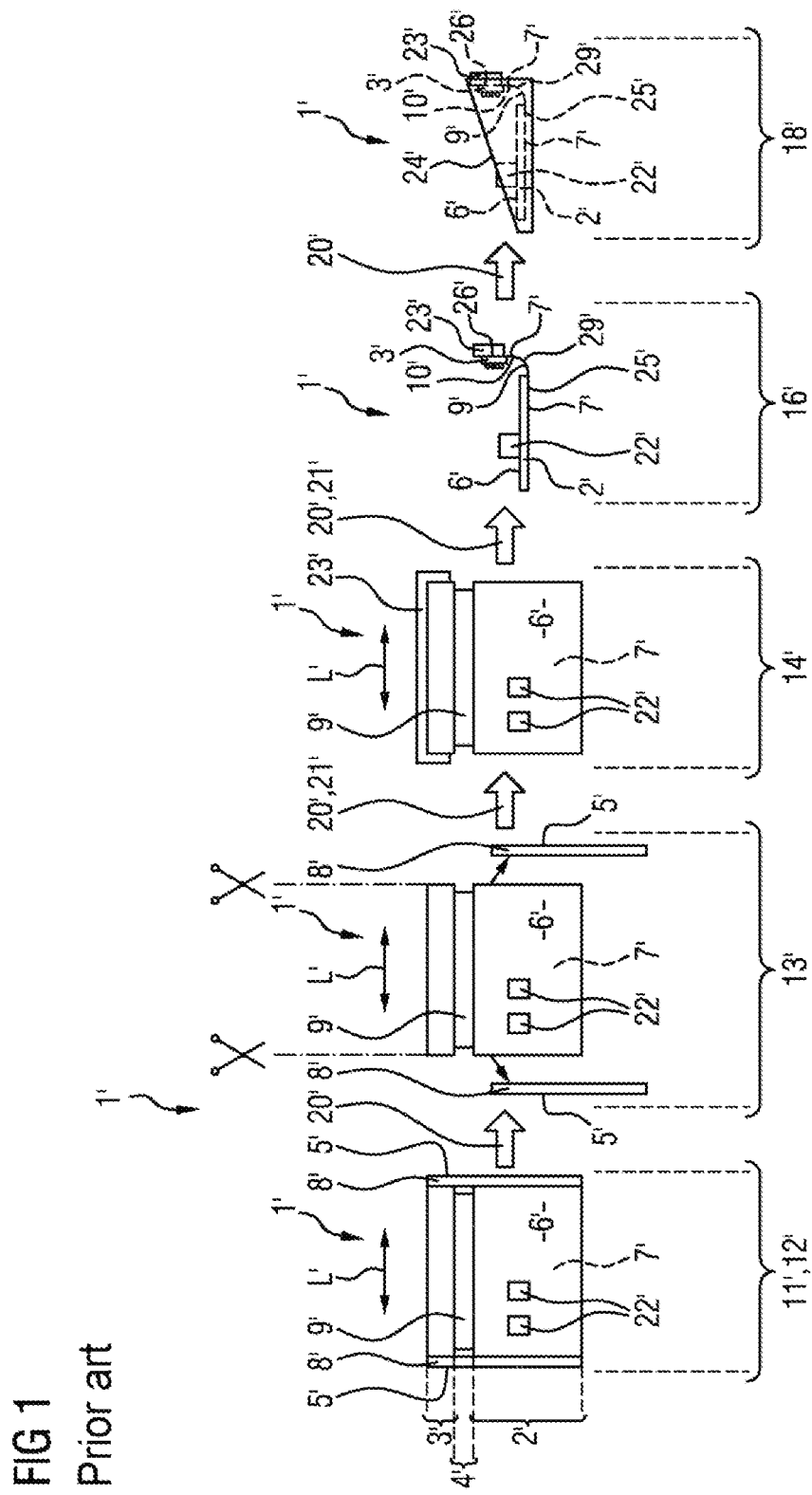
FIG. 1 schematically shows a printed circuit board in accordance with the prior art and a method for processing the known printed circuit board in accordance with the prior art.
Figure 2:
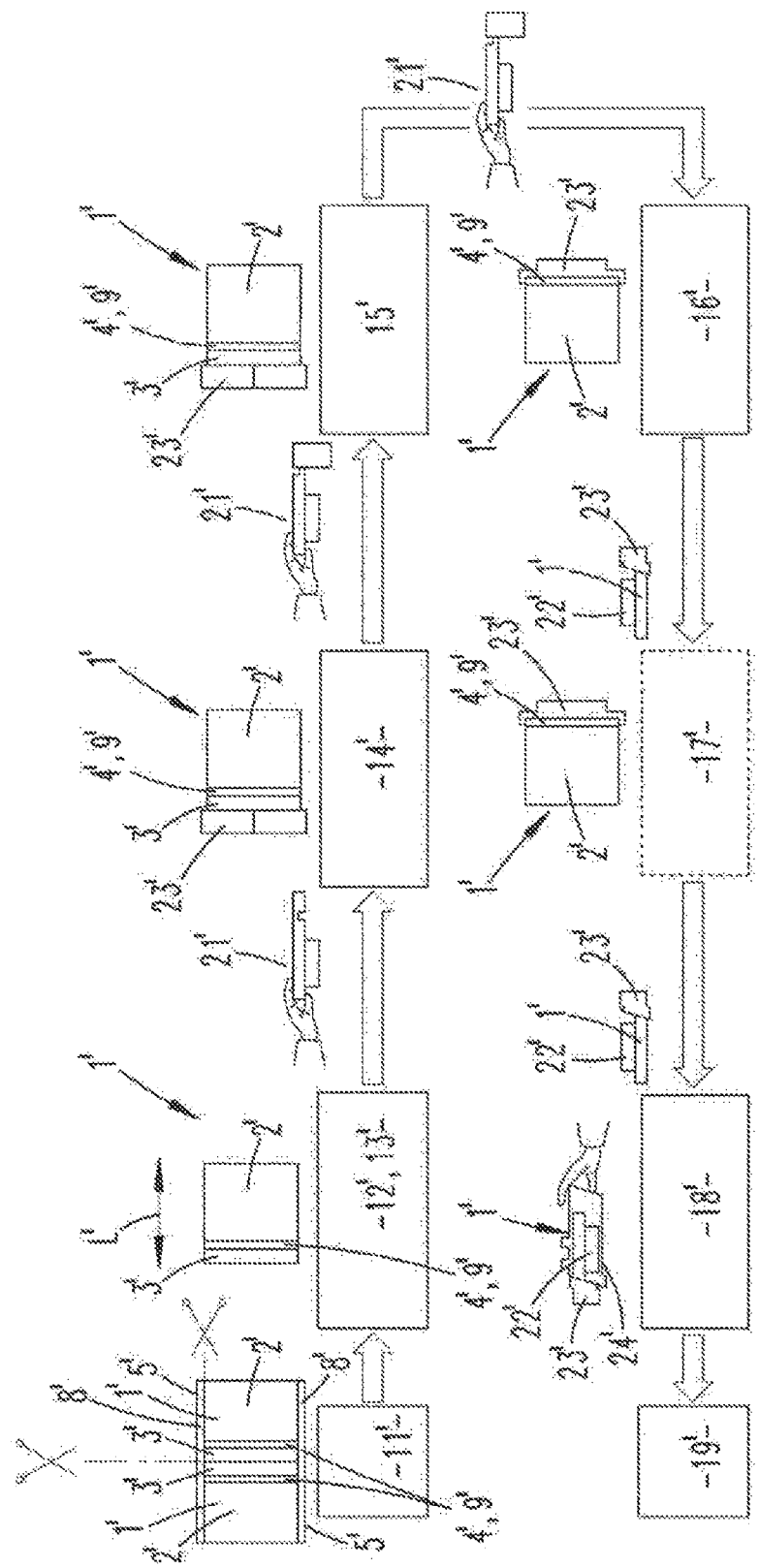
FIG. 2 shows the known printed circuit board shown in FIG. 1 and a further method for processing it that is known in the prior art.

Referring to FIG. 3, a printed circuit board 1 according to the invention in accordance with one preferred exemplary embodiment and a method according to the invention for processing said printed circuit board in accordance with one preferred exemplary embodiment are presented. The printed circuit board 1 comprises a first printed circuit board section 2, a second printed circuit board section 3 and a third printed circuit board section 4 therebetween. The printed circuit board sections 2, 3 and 4 extend along the printed circuit board longitudinal direction L, wherein the respective longitudinal ends are formed by two transverse edge outer sides 5. The first printed circuit board section 2 serves for population with electrical and/or electronic components 22, such as e.g. with capacitors, transistors, resistors etc. The second printed circuit board section 3 serves for connecting a circuit board connector 23. The third printed circuit board section 4, which extends as a narrow strip between the two printed circuit board sections 2 and 3, serves as a bending zone in order to be able to angle the printed circuit board sections 2 and 3 relative to one another. This makes it possible for the free contacts of the circuit board connector 23 to extend horizontally with respect to the plane of the first printed circuit board section 2, without angled contacts being required for this purpose. The printed circuit board 1 has, with regard to its surfaces, two printed circuit board sides facing in opposite directions, the first printed circuit board side thereof being designated by 6 and the second printed circuit board side thereof being designated by 7. The plan view of the printed circuit board 1, said plan view being shown first in FIG. 3, proceeding from the left-hand edge of the figure, schematically shows that the printed circuit board 1 has along its two transverse edge outer sides 5 a respective transverse edge strip 8, which extends firstly continuously between both longitudinal edge outer sides 27 and which is formed integrally proportionally by longitudinal ends of the printed circuit board sections 2, 3 and 4. In the third printed circuit board section 4, a strip-shaped depression 9 extends parallel to the printed circuit board longitudinal direction L in a central length section. Said depression can be produced by means of a milling method, wherein regions of the printed circuit board 1 were removed down to a desired depth. The depression forms a longitudinal groove that is open toward the first printed circuit board side 6, and brings about in the third printed circuit board section 4 a reduced printed circuit board thickness in comparison with the first and second printed circuit board sections 2, 3.

The layered construction of the printed circuit board 1 taken as a basis as an example in FIG. 3 is shown schematically in FIG. 3a. The printed circuit board sections 2 and 3 each contain three layers 10 composed of electrically insulating material. An electrically conductive conductor track is formed in each case between said layers 10 and on the two outer surfaces. On account of a milling process, only one of the layers 10 and, adhering thereto on the second printed circuit board side 7, a first conductor track section 29 are present in the third printed circuit board section 4. The first printed circuit board section 2 has a first conductor track section 25, and the second printed circuit board section 3 has a first conductor track section 26. The conductor track sections 25, 29 and 26 arranged on the surface of the second printed circuit board side 7 are electrically connected to one another, i.e. form a continuous first conductor track. At the two longitudinal ends of the depression 9, in each case a through opening 28 extends through the printed circuit board 1. Between a respective through opening 28 and the transverse edge outer side 5 adjacent thereto, a transverse edge strip 8 extends geometrically in each case, the width b of said transverse edge strip being determined by the distance between the through opening 28 and the adjacent transverse edge outer side 5, which distance is present parallel to the printed circuit board longitudinal direction L. In an initial state of the printed circuit board 1 as shown at the left-hand edge of FIG. 3, both transverse edge strips 8 run perpendicularly to the printed circuit board longitudinal direction L (that is to say in a printed circuit board transverse direction) continuously, that is to say without an intermediate interruption, between the two longitudinal edge outer sides 27. The first and second printed circuit board sections 2, 3 also extend continuously, i.e. without an interruption, parallel to the printed circuit board longitudinal direction L, while the third printed circuit board section 4 extends in a manner interrupted by the two through openings 28, rather than continuously, in the printed circuit board longitudinal direction L. Within the meaning of the terminology, the third printed circuit board section 4 thus concomitantly includes the two through openings 28. In the example, i.e. not necessarily, in the printed circuit board sections 2, 3 and in the third printed circuit board section 4 outside the through openings 28 the printed circuit board 1 has a multilayered construction, uniform with respect to one another. In the example in FIG. 3a, the conductor track sections 25 and 26 extend in an electrically conductive manner in each case from a respective region situated between the two transverse edge strips 8 right into the two transverse edge strips 8.

In the deviating example shown in FIG. 3b, four layers 10 composed of electrically insulating printed circuit board material, said layers being parallel to one another, extend in said sections or regions. An electrically conductive conductor track is formed in each case between adjacent layers 10 and on the outer surfaces of the outer layers 10 in the stack. In this example, the printed circuit board 1 has a strip-shaped depression 9 in each case on its two printed circuit board sides 6, 7 in the third printed circuit board section 4, wherein the two depressions 9 overlap. In the region of each depression 9, in each case the marginal layer 10 with its two adjoining conductor track sections was removed from the stack. Consequently, the two central layers 10 and the first conductor track section 29 of the third printed circuit board section 4, said first conductor track section being formed between said layers 10, are still situated between the two depressions 9. In the example, the central conductor track is composed integrally of a first conductor track section 25 of the first printed circuit board section 2, a first conductor track section 26 of the second printed circuit board section 3 and the first conductor track section 29 of the third printed circuit board section 4. In this exemplary embodiment, too, the printed circuit board sections 2 and 3 are thus electrically connected to one another even if (as also explained below) the transverse edge strips 8 have been severed in the third printed circuit board section 4. The two central layers 10 composed of electrically insulating material also extend in each case integrally from the first printed circuit board section 2 to the second printed circuit board section 3 through the third printed circuit board section 4. The first conductor track section 25 of the first printed circuit board section 2 extends continuously, i.e. in an electrically conductive manner, right into both transverse edge strips 8, specifically respectively as far as the transverse edge outer side 5 there. The first conductor track section 26 of the second printed circuit board section 3 also extends continuously, i.e. in an electrically conductive manner, right into both transverse edge strips 8, likewise specifically respectively as far as the transverse edge outer side 5. The transverse edge strips 8 thus form a conductor track area that is usable for the layout in the first and second printed circuit board sections 2, 3. In comparison with printed circuit boards known from the prior art, this results in an enlargement of the layout area. The first conductor track section 25 of the first printed circuit board section 2, the first conductor track section 26 of the second printed circuit board section 3 and the first conductor track section 29 of the third printed circuit board section 4 are formed integrally with one another.

Owing to the smaller printed circuit board thickness in the third printed circuit board section 4 in comparison with the printed circuit board sections 2, 3, said third printed circuit board section forms a bending hinge region. The two layers 10 composed of electrically insulating material that extend through the third printed circuit board section 4 in the example in FIG. 3b are sufficiently flexible that the two printed circuit board sections 2, 3 can be angled with respect to one another by means of bending.

In the example, in the initial state shown at the left-hand edge of the figure in FIG. 3, each transverse edge strip 8 has a uniform strip thickness d corresponding to the thickness of the first printed circuit board section 2 and the thickness of the second printed circuit board section 3. From a geometric standpoint, in the example, each transverse edge strip 8 additionally has a uniform strip width b, wherein the side edges of the transverse edge strips 8 extend perpendicularly to the printed circuit board longitudinal direction L.

In the initial state shown at the left-hand edge of FIG. 3, the first printed circuit board section 2 is populated with electrical components 22 on the first printed circuit board side 6, and the transverse edge strips 8 extend between the two longitudinal edge outer sides 27 of the printed circuit board 1, i.e. in the three printed circuit board sections 2, 3 and 4, with their four layers 10 in each case continuously. This initial state is designated by 31.

In the subsequent state designated by 32, a circuit board connector 23 was press-fitted (from behind in the viewing direction in relation to FIG. 3) into the second printed circuit board section 3. During the press-fitting, too, each transverse edge strip 8 comprises in the example in FIG. 3a three and in the example in FIG. 3b continuously four layers 10 composed of electrically insulating material, and so as a consequence a stiffening of the third printed circuit board section 4, which is otherwise reduced in thickness, results and unintentional warpage is avoided. As is shown in method step or state 33, in accordance with the method according to the invention, the transverse edge strips 8 are interrupted only shortly before the third printed circuit board section 4 is angled as desired, specifically only in the region of the third printed circuit board section 4. As a result, the third printed circuit board section 4, which is otherwise reduced in thickness, becomes pliable, i.e. the bending hinge is activated as it were by the interruption of the transverse edge strips 8. After that, the second printed circuit board section 3 can be angled by 90 degrees relative to the first printed circuit board section 2 by means of the bending hinge in the third printed circuit board section 4. The fact that the transverse edge strips 8 are interrupted only in the region of the third printed circuit board section 4 advantageously results in a reduction of waste and hence an optimization of costs. Moreover, the fact that the transverse edge strips 8 are interrupted only shortly before the desired angling advantageously results in more secure handling during production. Moreover, this enables a production process that is always identical at every production site of a company. The press-fit connector 23 can be for example what is referred to in German as Pressfit-Stecker. The press-fit connector 23 can have snap-action hooks, for example, which, after bending, can secure the bending state or angle of the printed circuit board. In the state designated by 34, the bent printed circuit board 1 according to the invention was mounted into a housing 24. The printed circuit board 1 and its circuit can be used, e.g. for control units, in particular for motor vehicle control units.

A method according to the invention in accordance with a further preferred exemplary embodiment will be described with reference to FIG. 4. In the initial state designated by 35, a plurality of printed circuit boards 1 according to the invention are still attached to one another and are populated with electronic components 22 (in part not concomitantly illustrated in FIG. 4). In the state 36, the printed circuit boards 1 according to the invention were separated from one another, but the transverse edge strips 8 have remained on the printed circuit boards 1 and, as in the initial state, also extend continuously through the third printed circuit board section 4. This enables simple handling 37 without the risk of unintentional warpage. In the state 38, a circuit board connector 23 was pressed onto the second printed circuit board section 3. Electrical functional testing at the component level is carried out in method step 39. It is only in the subsequent method step 40 that the transverse edge strips 8 are interrupted, specifically only in the region of the third printed circuit board section 4, and directly afterward the second printed circuit board section 3 with the circuit board connector 23 is angled relative to the first printed circuit board section 2. After that, the printed circuit board 1 is fixed by means of snap-action hooks of the circuit board connector 23 in order to fix the desired bend. The interruption of the transverse edge strips 8 can preferably be carried out directly within a bending machine in which the bending of the printed circuit board 1 is also carried out. A functional test of all functions of the circuit of the printed circuit board 1 is carried out in method step 41. In the state 42, the bent printed circuit board 1 was incorporated into a housing 24, and a final test is carried out in method step 43.

FIGS. 5 and 6 show a printed circuit board 1 according to the invention with the construction also chosen by way of example in FIGS. 3, 4, but in an enlarged view by comparison therewith. These illustrations also clearly reveal that the transverse edge strips 8 are interrupted or removed only in the region of the third printed circuit board section 4. In the case of a printed circuit board according to the invention, a holding frame known from conventional printed circuit boards, which is costly and has to be disposed of, is replaced by a less expensive section of a printed circuit board. Preferably, the printed circuit board can be what is referred to in German as a Printed Circuit Board (PCB). By virtue of the fact that the transverse edge strips 8 are interrupted only after the press-fitting of the circuit board connector 23 or shortly before the bending of the printed circuit board 1, particularly simple handling of the printed circuit board 1 is made possible between the method steps.

It goes without saying that a printed circuit board within the scope of the invention can have a layered construction deviating from the figures. Moreover, a printed circuit board within the scope of the invention can comprise one depression or a plurality of depressions deviating from the exemplary embodiment shown in the figures.

All the disclosed features are essential to the invention (individually or else in combination with one another). The dependent claims, by way of their features, characterize independent inventive developments of the prior art, in particular for the purpose of filing divisional applications on the basis of said claims.

The invention claimed is:

1. A printed circuit board, comprising:
a first printed circuit board section, a second printed circuit board section, and a third printed circuit board section, said first, second, and third printed circuit board sections extending along a printed circuit board longitudinal direction between two transverse edge outer sides of the printed circuit board;
said third printed circuit board section being disposed between said first printed circuit board section and said second printed circuit board section;
a first printed circuit board side and a second printed circuit board side of the printed circuit board facing in mutually opposite directions;
two longitudinal ends of the printed circuit board each having a respective transverse edge strip, each one of said two transverse edge strips including regions of said first, second, and third printed circuit board sections at least in an initial state of the printed circuit board, and each one of said two transverse edge strips extending continuously transversely with respect to the printed circuit board longitudinal direction along a transverse edge outer side of the printed circuit board, at least in the initial state of the printed circuit board;
said third printed circuit board section being formed with a depression oriented along the printed circuit board longitudinal direction formed on the first printed circuit board side between said two transverse edge strips;
at least one printed circuit board section selected from the group consisting of said first printed circuit board section and second printed circuit board section including a first metallic conductor track section extending electrically conductively along one of said two transverse edge strips or extending electrically conductively along both of said two transverse edge strips.

2. The printed circuit board according to claim 1, wherein said first conductor track section of said first printed circuit board section extends electrically conductively as far as one transverse edge outer side or electrically conductively as far as both said transverse edge outer sides, and/or wherein said first conductor track section of the second printed circuit board section extends electrically conductively as far as one transverse edge outer side or electrically conductively as far as both transverse edge outer sides.

3. The printed circuit board according to claim 1, wherein said third printed circuit board section has a first metallic conductor track section, which connects said first conductor track section of said first printed circuit board section and said first conductor track section of said second printed circuit board section to one another in an electrically conductive manner.

4. The printed circuit board according to claim 1, wherein said third printed circuit board section is bendable, rendering the printed circuit board bendable in said third printed circuit board section, and the printed circuit board having at least one flexible layer composed of electrically insulating printed circuit board material, said at least one flexible layer extending in said first, second, and third printed circuit board sections.

5. The printed circuit board according to claim 4, wherein said third printed circuit board section is elastically bendable and said at least one flexible layer extends integrally continuously in said first, second, and third printed circuit board sections.

6. The printed circuit board according to claim 1, wherein a respective through opening is formed in the printed circuit board between a respective longitudinal end of the strip-shaped depression and the transverse edge strip adjacent thereto.

7. The printed circuit board according to claim 1, wherein each transverse edge strip has a uniform strip thickness that corresponds to a thickness of the printed circuit board in a region of said first printed circuit board section and/or to the thickness of the printed circuit board in a region of said second printed circuit board section.

8. The printed circuit board according to claim 1, wherein each transverse edge strip has a uniform strip width, wherein side edges of said transverse edge strips extend transversely with respect to the printed circuit board longitudinal direction.

9. The printed circuit board according to claim 1, wherein a depression oriented in a strip-shaped fashion along the printed circuit board longitudinal direction is formed in the third printed circuit board section on the second printed circuit board side between said two transverse edge strips, and wherein said first printed circuit board section has a second metallic conductor track section and/or said second printed circuit board section has a second metallic conductor track section, said second conductor track section of said first printed circuit board section extends in an electrically conductive manner directly into one of said two transverse edge strips or in an electrically conductive manner directly into both said transverse edge strips, and/or said second conductor track section of said second printed circuit board section extends in an electrically conductive manner into one of said two transverse edge strips or in an electrically conductive manner into both said transverse edge strips.

10. An arrangement, comprising:
a printed circuit board according to claim 1;
electrical and/or electronic components populated on the first printed circuit board section on one printed circuit board side or on both printed circuit board sides; and/or
a circuit board connector being a press-fit connector or a solder-in connector connected to the second printed circuit board section.

11. The arrangement according to claim 10, wherein the transverse edge strips, which are continuous in an initial state, have been interrupted or have been removed only in the third printed circuit board section.

12. The arrangement according to claim 10, wherein the printed circuit board is bent in the third printed circuit board section, such that a first plane running parallel to the first printed circuit board section and a second plane running parallel to the second printed circuit board section intersect at an angle of substantially 90 degrees.

13. A method for processing a printed circuit board in production, the method comprising the following method steps:
providing at least one printed circuit board according to claim 1;
populating the printed circuit board with electrical and/or electronic components;
attaching a circuit board connector to the second printed circuit board section;
bending the printed circuit board, such that a first plane running parallel to the first printed circuit board section and a second plane running parallel to the second printed circuit board section enclose a given angle with one another;
prior to bending, interrupting the transverse edge strips, which are continuous at least in an initial state, only in the third printed circuit board section or removing the transverse edge strips only in the third printed circuit board section.

14. The method according to claim 13, wherein the populating step comprises populating the printed circuit board with unwired components, the attaching step comprises attaching a press-fit connector or a solder-in connector to the second printed circuit board section, and the bending step comprises bending the printed circuit board to form the given angle at substantially 90 degrees.

15. The method according to claim 13, wherein the step of interrupting the transverse edge strips only in the third printed circuit board section or removing the transverse edge strips only in the third printed circuit board section is carried out between the steps of attaching the circuit board connector and bending the third printed circuit board section.

16. The method according to claim 13, which comprises:
interrupting the transverse edge strips in the third printed circuit board section by opening the transverse edge strips by cutting, slitting, sawing, or severing by machining, or severing by a punch, or severing by heat injection; or
removing the transverse edge strips in the printed circuit board section by notching out, or milling away, or removing by a machining process, or removing by punching, or releasing and removing.

17. The method according to claim 13, which comprises providing circuit board connectors having snap-action hooks and, after the step of bending the third printed circuit board section, securing the bent shape of the printed circuit board with the snap-action hooks.

* * * * *